(12) United States Patent
Dungan et al.

(10) Patent No.: US 8,536,693 B2
(45) Date of Patent: Sep. 17, 2013

(54) TIERED INTEGRATED CIRCUIT ASSEMBLY AND A METHOD FOR MANUFACTURING THE SAME

(75) Inventors: Thomas Dungan, Fort Collins, CO (US); Peter Mark O'Neill, Fort Collins, CO (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 453 days.

(21) Appl. No.: 12/840,218

(22) Filed: Jul. 20, 2010

(65) Prior Publication Data

US 2012/0020027 A1  Jan. 26, 2012

(51) Int. Cl.
*H01L 23/02* (2006.01)

(52) U.S. Cl.
USPC ........... 257/686; 257/706; 257/777; 361/718; 361/790; 29/830

(58) Field of Classification Search
USPC ................. 257/686, 691, 706, 720, 758, 774, 257/777; 361/718, 790; 29/830
See application file for complete search history.

(56) References Cited

U.S. PATENT DOCUMENTS

| | | | |
|---|---|---|---|
| 6,297,072 B1 | 10/2001 | Tilmans et al. | |
| 7,385,283 B2 | 6/2008 | Wu et al. | |
| 7,494,909 B2 | 2/2009 | Ju et al. | |
| 7,564,138 B2 | 7/2009 | Pardo et al. | |
| 7,573,723 B2 | 8/2009 | Lifton et al. | |
| 2012/0020027 A1* | 1/2012 | Dungan et al. | 361/718 |

OTHER PUBLICATIONS

Stevenson, Daniel S. et al., Architecture of a Vertically Stacked Reconfigurable Computer, 2008 I.E.E.E. Explore, 6 pp.
Sze, T. et al., Proximity Communication Flip-Chip Package With Micron Chip-to-Chip Alignment Tolerances, 2009 Electronic Components and Technology Conference, I.E.E.E., pp. 966-971.

* cited by examiner

*Primary Examiner* — Jack Chen

(57) ABSTRACT

A tiered integrated circuit (IC) assembly includes stacks of a limited number of ICs coupled to each other and arranged in a first direction across a base tier and a second tier. The base tier includes ICs and a data bridge. Each of the ICs includes a respective array of through silicon vias (TSVs) arranged in parallel with the first direction. The data bridge includes submicron metal interconnects (densely spaced electrical conductors) arranged in a plane that is substantially orthogonal to the first direction. The second tier is adjacent to the base tier and includes respective high-performance ICs different from the ICs of the base tier. The TSVs provide power and ground paths to the ICs in the second tier. In an example embodiment, the ICs in the second tier support one or more data bridges for connecting adjacent stacks.

18 Claims, 8 Drawing Sheets

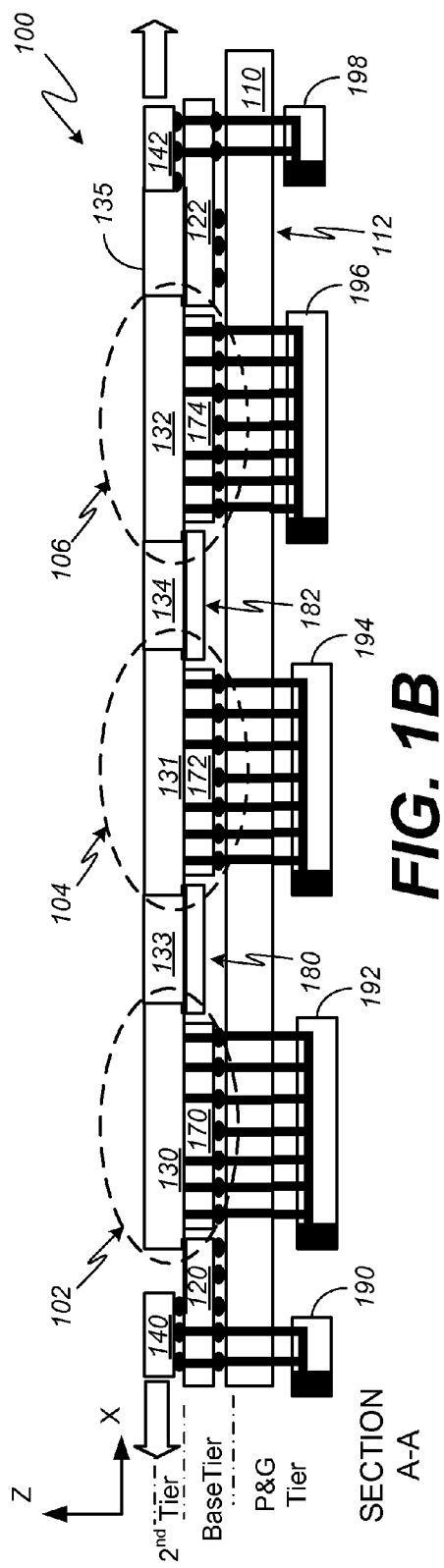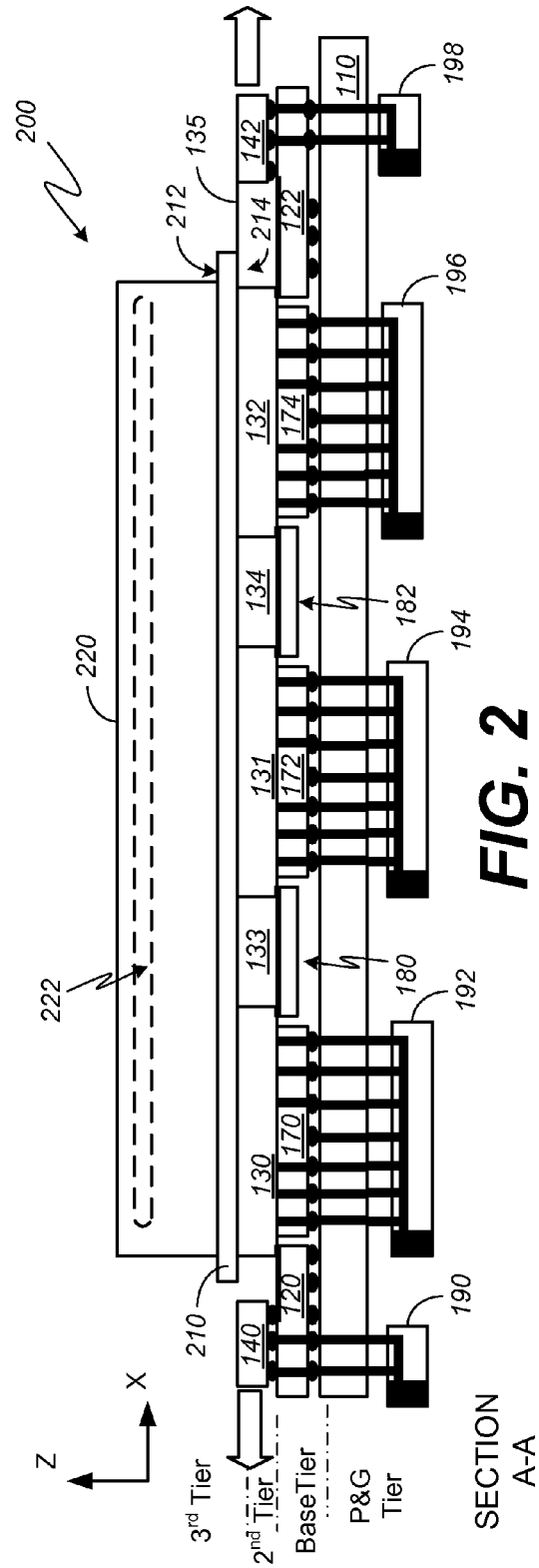

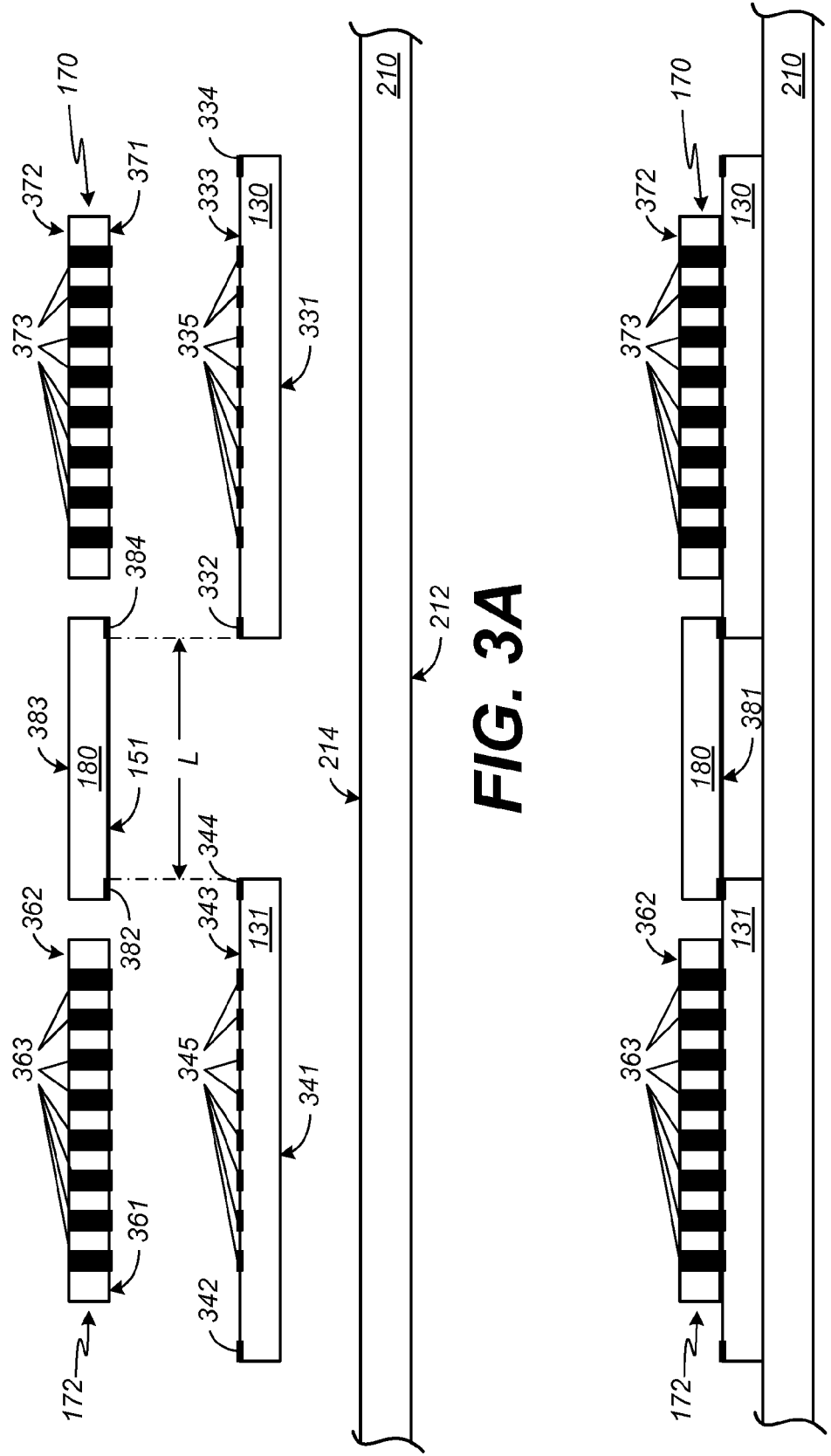

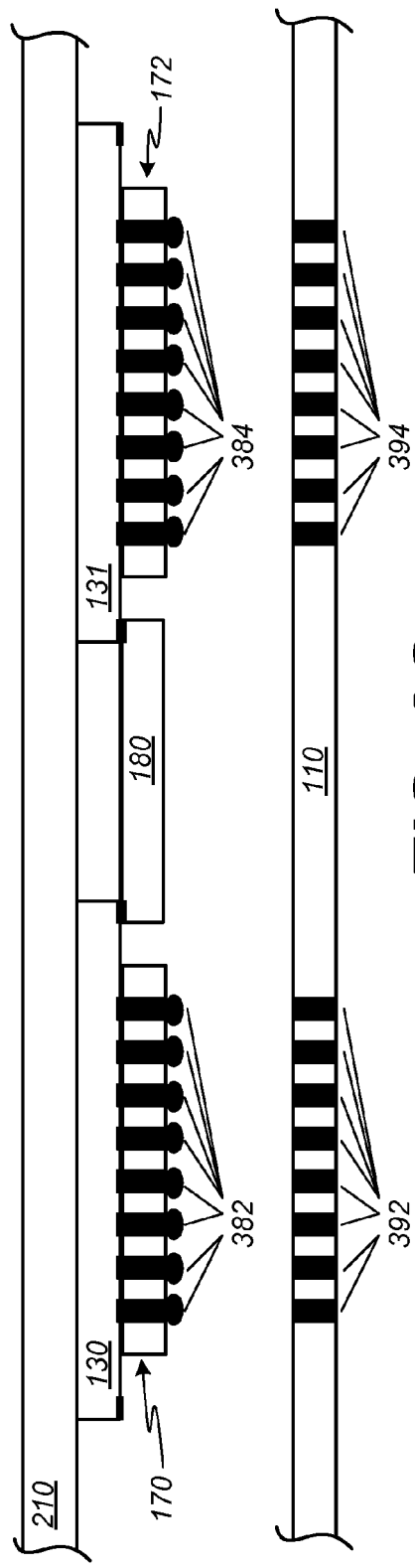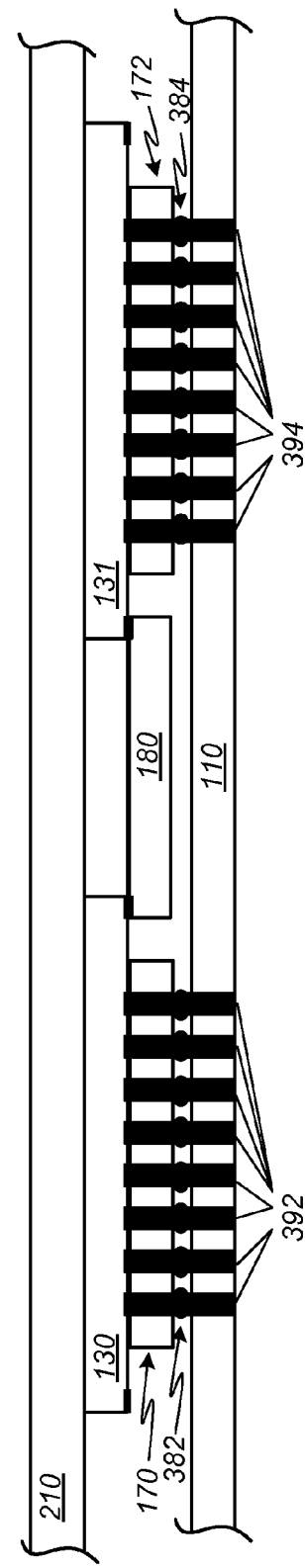

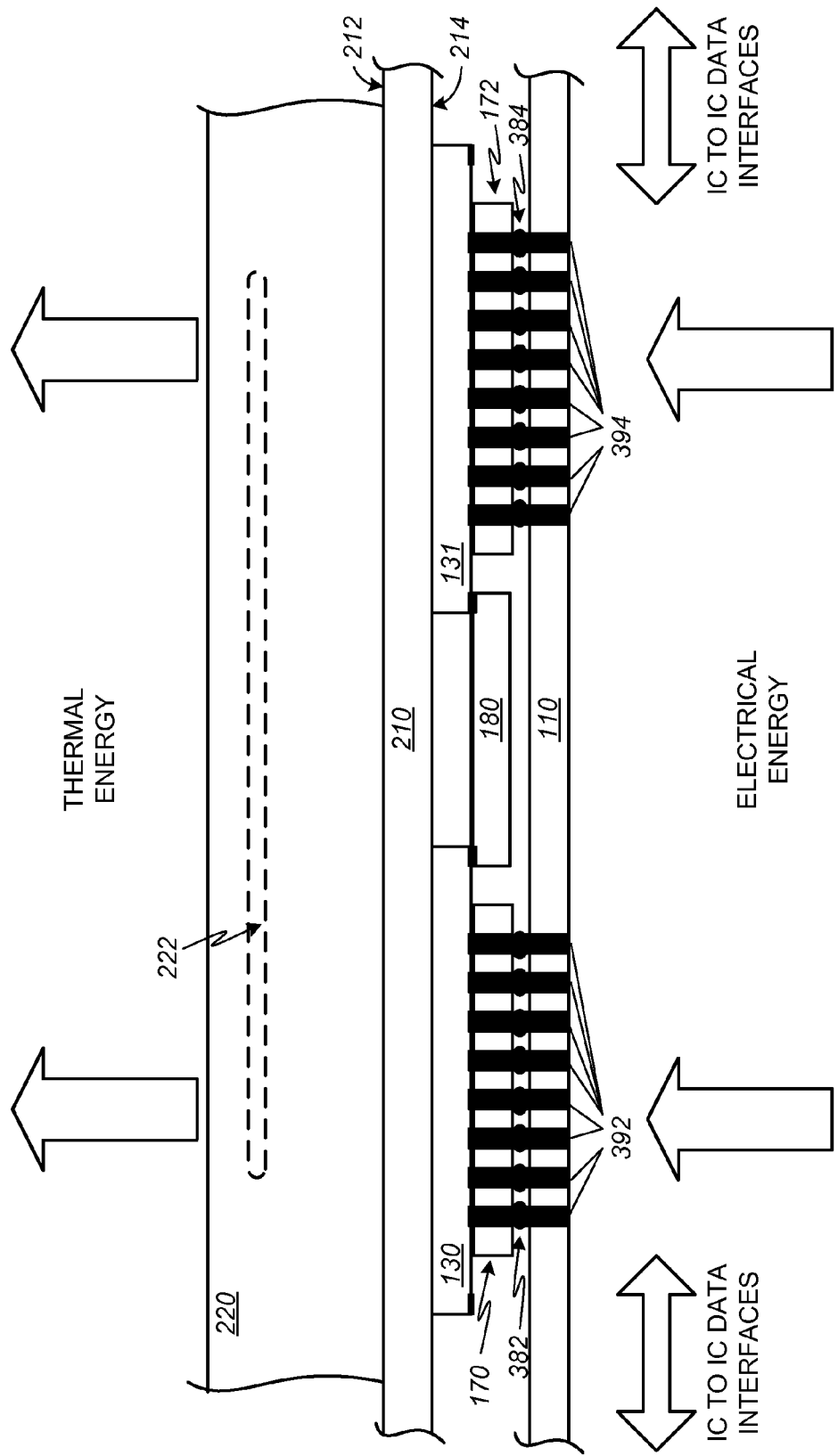

TIERED INTEGRATED CIRCUIT ASSEMBLY AND A METHOD FOR MANUFACTURING THE SAME

BACKGROUND

Conventional electronic systems for computation, communication, and other applications are typically built up from integrated circuits (ICs) arranged in packages or chips and connected to power supplies, circuit elements and other ICs in separate packages or chips by way of wiring traces on printed circuit boards. Each IC requires connections through the package for power and electrical ground returns, as well as other package connections, which can include both low-rate control signals and relatively high-rate data signals.

The rate of increases in on-circuit density and operating frequency of high-performance ICs have exceeded the rate of increase in interconnections available between packages and printed circuit boards. The availability of parallel busses built from extremely dense interconnect wiring within an IC enables a greater number of data bits to be communicated from one circuit element to another circuit element (in the IC) than the number of data bits that can be communicated by the relatively lower number and larger scale data interconnections available between the package and the printed circuit board. Because the interconnect density between package and printed circuit board is much lower than on-chip interconnect density, typical implementations of high-performance computing and communication chips include complex serialization-deserialization circuitry associated with high-speed I/O ports to multiplex and demultiplex signals from the higher density data paths within the IC across a significantly lower number of package-to-board connections. To communicate or transfer data efficiently, chip-to-chip or off-chip communication data rates have to increase even more rapidly than on-chip clock rates.

High speed serialization-deserialization circuit blocks require additional transistors, consume chip area, and power, and can generate potentially significant levels of noise on power and data connections. Moreover, the off-chip data rates required to supply the on-chip information capacity demand lead to unavoidable high-frequency attenuation in the chip-to-package-to-printed-circuit-board channels. Thus far, system designers have employed increasingly more complicated predistortion and signal recovery techniques to compensate for the high-frequency signal power losses in these channels. Despite continuous efforts to improve the speed and power efficiency of serialization-deserialization techniques, and to further increase package interconnection density, the printed-circuit-board-to-package interconnections are projected to present a bandwidth bottleneck that will increasingly limit future high-performance electronic computing and communication systems.

In addition to the above-described bottleneck, any alternative to the conventional chip-in-package-on-board configuration must satisfy additional constraints that result from the conventional high-performance IC. Accordingly, such alternative configurations must also provide thermal-expansion compliant interfaces, low-impedance, electro-migration compliant power and ground connections, and efficient mechanisms for transferring heat energy away from the high-performance IC.

One method with potential to eliminate the bottlenecks caused by IC-package-board-package-IC data communication channels involves vertically stacking ICs and using through-silicon vias and dense arrays of electrically conductive signal paths. However, such alternative configurations, with several vertically arranged high-performance ICs, would suffer from severe problems with heat removal from the interior of the resulting stack. In addition, a vertical arrangement of high-performance ICs would have difficulty providing electro-migration compliant power supply feeds for each of the high-performance ICs within the available area at the base of a stack of high-performance ICs.

Another possible solution is to arrange the high-performance ICs laterally and to interconnect them with a "silicon circuit board." Unlike a conventional organic laminate printed circuit board or even a higher performance laminate or ceramic multichip module substrate, a silicon circuit board is composed of the same materials and fabricated with the same technology as the ICs. Therefore, the conductors of a silicon circuit board have density and signal integrity similar to the conductors on the high-performance ICs.

Though silicon circuit boards have been proposed and demonstrated they suffer several drawbacks. One is that, being made with the same equipment, a silicon circuit board is limited to about the same size as the largest ICs it might support by the exposure field size of the photolithographic step-and-repeat camera. Though exposure fields can be stitched together over larger areas, this process is slow and not commonly available. A more fundamental problem is that IC-type conductors tend to delaminate from their silicon substrate when they are used for distances as long as the width of several chips due to thermal expansion mismatch between the silicon and the conductor material.

SUMMARY

To address the various constraints and issues presented in conventional IC assemblies, disparate ICs are arranged in short vertical stacks with each stack receiving power and ground through an independent (thermally-compliant) connector, with heat sinking or thermal energy transfer through a face of the stack opposite the power and ground connections, and with stack-to-stack signaling through a laterally arranged data bridge. The data bridge includes a bus composed of (typically multilayer) submicron metal conductors or interconnects (i.e., electrical conductors) for signal transfers between adjacent high-performance ICs. The data bridge can be manufactured using the same techniques and equipment used to construct the high-performance ICs, so that the interconnect bandwidth across the data bridge is equal to the intra-circuit interconnect bandwidth available on the high-performance ICs.

Each short stack can comprise a single high-performance IC such as a microprocessor, an application-specific integrated circuit (ASIC), or other IC devices that generate thermal energy at a rate that requires a thermal transfer element to maintain thermal equilibrium within a range of temperatures that will not damage or shorten the useful life of the high-performance IC. The high-performance IC is coupled to a silicon platen or substrate for thermally compliant support. Supplemental or support ICs that do not require a thermal transfer element to maintain thermal equilibrium within a range of temperatures that will not damage or shorten the useful life of the supplemental ICs can be integrated with an array of through-silicon vias (TSVs). The TSVs provide the power and ground and perhaps low-speed control signals from the independent connector to the high-performance IC and the one or more supplemental ICs in the stack. That is, the one or more supplemental ICs may be stacked in layers between the high-performance IC and the independent and thermally-compliant connector. The supplemental ICs may include, by way of non-limiting examples, memory elements, bypass capacitors, power regulators, transistors, and electrostatic discharge protectors, among other relatively low-power consuming devices.

An embodiment of a tiered assembly of ICs includes a base tier and a second tier adjacent to the base tier. The base tier includes a first set of ICs and at least one data bridge. The members of the first set of ICs each have a respective array of TSVs. The first set of ICs or supplemental ICs include the low-power consuming devices. The data bridge includes a set of submicron metal interconnects (i.e., electrical conductors) arranged in a plane that is substantially orthogonal to a longitudinal axis of the TSVs. The electrical conductors may be arranged along or in multiple layers near a surface of the data bridge. The second tier includes a second set of ICs different from the first set of ICs. The second set of ICs (or high-performance ICs) generates thermal energy at a rate that requires an external thermal transfer element to maintain thermal equilibrium within the respective members of the second set of ICs. At least two adjacent members of the second set of ICs are coupled to each other by the data bridge. The submicron metal interconnects of the data bridge provide an interconnect density and signal integrity between the coupled members of the second set of ICs that is substantially similar to that provided by internal connections in the second set of ICs.

An alternative embodiment of a tiered IC assembly includes a first tier and a second tier adjacent to the first tier. The first tier is characterized by a combination of a first set of ICs and one or more data bridges arranged between adjacent members of the first set of ICs. The members of the first set of ICs each have a respective array of TSVs. The data bridges include submicron metal interconnects arranged along or near a respective surface of the data bridges. The second tier includes a second set of ICs that generate thermal energy at a rate that requires an external thermal transfer element to maintain thermal equilibrium. Adjacent members of the second set of ICs are coupled to one another by the data bridges. The submicron metal interconnects of the data bridge provide an interconnect density and signal integrity between the second set of ICs coupled by the data bridge that is substantially similar when compared to the interconnect density and signal integrity provided by internal connections in the second set of ICs. The data bridges overlap and are supported by the second set of ICs in the second tier.

An embodiment of a method for manufacturing a tiered IC assembly includes the steps of providing a silicon platen having a first surface and a mounting surface opposed to the first surface, attaching a non-active surface of each of a set of high-performance ICs to the mounting surface, the set of high-performance ICs separated from adjacent members of the set along at least a first direction, coupling a first data bridge to adjacent members of the set of high-performance ICs, the data bridge having submicron interconnects arranged in a plane that is substantially parallel to the mounting surface, the submicron metal interconnects of the data bridge providing an interconnect density and signal integrity, between the high-performance ICs coupled by the first data bridge, that is substantially similar to that provided by internal connections in the high-performance ICs, arranging a first set of supplemental ICs, different from the set of high-performance ICs, in registration with members of the set of high-performance ICs, the first set of supplemental ICs each comprising a respective array of TSVs arranged in a direction that is substantially orthogonal to the mounting surface, coupling each member of the first set of supplemental ICs to a respective mounting surface of a corresponding high-performance IC by way of the array of TSVs in the first set of supplemental ICs and coupling each of the first set of supplemental ICs to respective connectors by way of the respective TSVs.

The figures and detailed description that follow are not exhaustive. The disclosed embodiments are illustrated and described to enable one of ordinary skill to make and use the tiered IC assemblies. Other embodiments, features and advantages will be or will become apparent to those skilled in the art upon examination of the following figures and detailed description. All such additional embodiments, features and advantages are within the scope of the assemblies and methods for the manufacture thereof as defined in the accompanying claims.

BRIEF DESCRIPTION OF THE FIGURES

The tiered IC assemblies and methods for constructing the same can be better understood with reference to the following figures. The components within the figures are not necessarily to scale, emphasis instead being placed upon clearly illustrating the principles of forming a tiered IC assembly by the select arrangement of disparate ICs in a base tier that provides power and ground to a second tier by way of a first set of ICs and that further provides high-speed data signal paths by way of one or more data bridges that provide data signal bandwidth and signal integrity that closely compares to that available within high-performance ICs distributed across the second tier. Moreover, in the figures, like reference numerals designate corresponding parts throughout the different views.

FIGS. 1A and 1B include a top plan view and a cross-sectional view of an embodiment of a tiered IC assembly.

FIG. 2 is a cross-sectional view of an alternative embodiment of a tiered IC assembly.

FIGS. 3A-3E schematically illustrate a method of assembling a portion of the tiered IC assembly of FIG. 2.

DETAILED DESCRIPTION

Figure 1A:
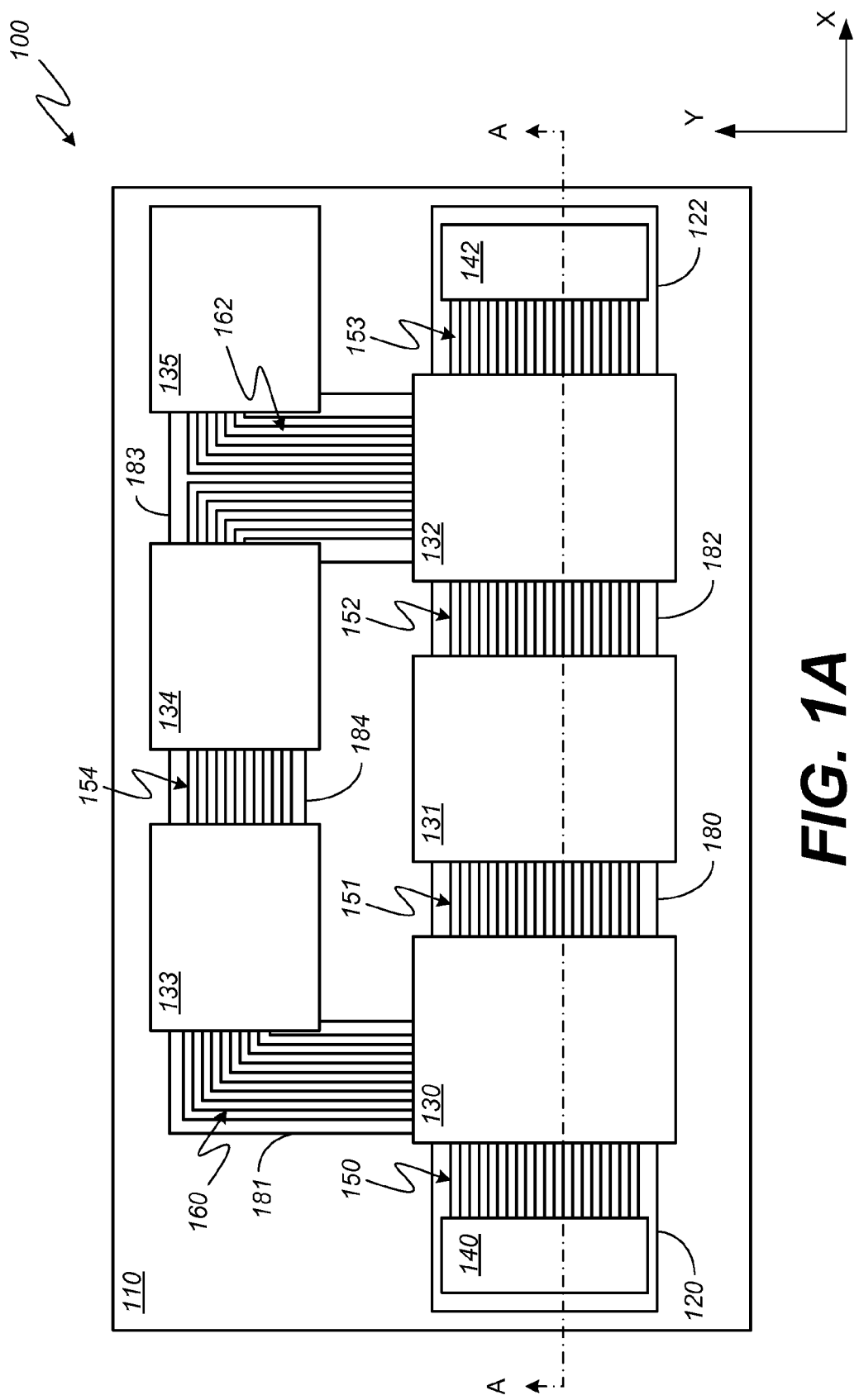

The demands for low-impedance power and ground access, high-efficiency heat sinking, thermal compliance, ultra-high bandwidth, and power-efficient signaling, are met simultaneously by disposing disparate ICs in short vertical stacks with each stack receiving power and ground through an independent (thermally-compliant) connector, with heat sinking through a face of the stack opposite the power and ground connections, and with stack-to-stack signaling through a laterally arranged data bridge. The short stacks of the tiered IC assemblies include a single instance of a high-performance IC. Example high-performance ICs include microprocessors, application-specific ICs, high-capacity routers, switches, repeaters, among others. These high-performance ICs generate thermal energy at a rate that requires a thermal transfer element to maintain thermal equilibrium within a range of temperatures that will not damage or shorten the life of the device.

The data bridge is constructed on a silicon die and provides a VLSI-density bus. Accordingly, the high-performance ICs and the data bridge have interconnects of similar dimensions that are constructed or manufactured from similar technologies and similar materials. Typically, the data bridge includes a bus of submicron interconnects arranged in one or more layers at or near the surface of the data bridge. The VLSI-density bus (i.e., electrical conductors) can be arranged in a parallel configuration. The electrical connections or interconnects are arranged in a plane that is substantially parallel with a major surface of the ICs of the assembly. The data bridge can be configured in multiple configurations. For example, the interconnects of a data bridge can be arranged substantially in parallel with each other in a single direction. In an alternative arrangement, some or all of the interconnects of a data bridge are arranged in an "L"-shaped configuration. In another example embodiment, the interconnects of a data bridge are arranged in a "T"-shaped configuration.

In one embodiment, the short vertical stacks or sub-assemblies are mounted on a silicon platen. In an alternative embodiment, the short vertical stacks or sub-assemblies are interposed between a first silicon platen and a second silicon platen with TSVs arranged therein. The short vertical stacks are arranged in a direction that is substantially orthogonal to the electrical connections of the data bridge, which connects respective high-performance ICs from separate and adjacent stacks to each other. The number of ICs in the stacks is relatively small, as limited by power and signal routing and heat dissipation constraints. An example sub-assembly or stack includes a single high-performance IC (e.g., an IC that consumes relatively more power than other types of ICs) in direct contact with a heat sink, and zero, one, or a small number of supplemental or support ICs. A set of supplemental ICs are aligned in registration with a corresponding high-performance IC and provide power and ground paths to the same by way of TSVs. The set of supplemental ICs may include circuit elements (e.g., memory elements) that consume relatively less power than the power consumed in the corresponding high-performance IC. A data bridge overlaps a portion of the perimeter of a first high-performance IC in a first stack. The data bridge also overlaps a portion of the perimeter of a second high-performance IC in a second stack and spans the distance between the adjacent first and second stacks, linking the stacks together.

In a basic embodiment, the example tiered or stacked IC assemblies (TICAs) include a base tier and an adjacent second tier. The second tier includes a set of high-performance ICs such as, for example, microprocessors, ASICs, high-capacity routers, switches, repeaters, among others. The second tier IC devices are separated from each other along at least a first direction. These high-performance ICs include data inputs and data outputs generally arranged along their respective perimeters. When the TICA is arranged in a two-dimensional array of ICs, the second tier ICs are separated from each other along a first direction and a second direction that is substantially orthogonal to the first direction. For TICA embodiments where it is desirable to communicate with devices remotely located from the TICA (i.e., off-TICA devices), the second tier can also include optical devices.

The base tier further includes a set of supplemental ICs arranged in an alternating fashion with at least one data bridge there between. These supplemental ICs are different than the high-performance ICs in the second tier. A first set of supplemental ICs includes an array of TSVs to provide supply voltages and ground connections to a respective second tier circuit device arranged in registration with each member of the first set of supplemental ICs. In some example embodiments, the first set of supplemental ICs may receive one or more control signals in addition to the power and ground connections. These control signals and power and ground connections are provided by way of the TSVs. To provide these connections, the members of the first set of supplemental ICs are arranged in vertical registration with a respective high-performance IC. In addition to providing power and ground, the first set of supplemental ICs may comprise additional circuits or elements (e.g., a memory circuit) to support one or more functions of the respective second tier device. Solder bumps, conductive pillars, other electrically conductive structures are used to couple the supplemental ICs to the corresponding high-performance IC. Alternatively, disparate ICs and data bridges can be coupled to one another by metal-to-metal thermal compression and or fusion bonding.

A data bridge is arranged on or within the layers of a dedicated silicon chip. Although the electrical connections on the data bridges can be arranged in "L"-shaped and "T"-shaped configurations, in general, the dedicated silicon chips themselves are arranged in rectangular configurations so as to overlap corresponding edges of adjacent high-performance ICs in separate and adjacent stacks. A data bridge includes at least a first data terminal and a second data terminal. The first data terminal includes a desired number of interconnects or electrical conductors arranged along a first edge of the dedicated silicon substrate of the data bridge. The second data terminal similarly includes a desired number of interconnects or electrical conductors arranged along a second edge of the dedicated silicon substrate. The first and second data terminals may be arranged along adjacent, opposed or even other edges of the silicon chip as may be desired. The first and second data terminals are connected to one another by electrical conductors that traverse the data bridge and that are arranged in a plane that is substantially orthogonal to the TSVs. The data bridge includes a desired number of electrical conductors or submicron interconnects arranged substantially in parallel to each other along or near a surface of the dedicated silicon chip. The first data terminal overlaps a corresponding portion of a first high-performance IC to permit N parallel data signal connections. The second data terminal overlaps a corresponding portion of a second high-performance IC removed from the first high-performance IC and further couples the N parallel data signal connections to the second high-performance IC. The first and second high-performance ICs are nearest neighbors to each other and are communicatively coupled to each other by the first and second terminals and the electrical conductors or submicron interconnects of the data bridge. Accordingly, the base tier of the TICA is characterized by power and ground signals that traverse the tier in a first direction and high-speed data signals that move across the tier in a second direction that is orthogonal to the first direction.

When it is desired to communicate with off TICA devices, the base tier may include one or more additional ICs having TSVs to provide power and ground to transceivers for communicating with the off TICA devices. These additional ICs will generally be deployed near the outermost edges of the assembly. When optical communication media are deployed, the one or more additional ICs may include buffers, converters, amplifiers, and power controllers for supporting and managing such communications. Alternatively, data signals can be routed to off TICA devices via TSVs in the base tier and in an interposer adjacent to or within the base tier.

In some embodiments, additional tiers are added to the above-described base and second tiers. For example, a thermal transfer tier can be added adjacent to the second tier and a power and ground tier can be added adjacent the base tier. The thermal transfer tier may include a silicon substrate or platen and/or a heat sink. The power and ground tier may include a separate silicon platen with TSVs to provide power and ground to devices in the base tier.

Turning now to the drawings, wherein like reference numerals designate corresponding parts throughout the drawings, reference is made to FIG. 1A and FIG. 1B, which include a top plan view and a corresponding cross-sectional view in the direction of line A-A of an embodiment of a TICA 100. The TICA 100 in the illustrated embodiment is shown without a plate or platen above the ICs in the uppermost tier. The absent plate or platen can be used as a base surface upon which the TICA 100 can be assembled. Absent such a platen, the TICA 100 may require an alignment sensitive process flow capable of closely overlapping and aligning data terminals of data bridges with adjacent high-performance ICs from separate stacks. In the illustrated embodiment, the plate or platen and a heat transfer element such as a heat sink have been removed to show features of the first or lowermost tier of the TICA 100.

The TICA 100 includes a silicon substrate, plate or platen 110 upon which laterally disposed and separated high-performance VLSI circuits communicate with each other and additional IC devices by way of high-speed data paths (i.e., VLSI-density busses) provided along or near corresponding surfaces of data bridges located between the various ICs. As illustrated in FIG. 1A and FIG. 1B, the high-performance IC 130 is conductively coupled to high-performance IC 131, high-performance IC 133 and with the transceiver 120. The high-performance IC 130 is coupled to the high-performance IC 131 by way of submicron interconnects (i.e., densely arranged electrical conductors) 151 arranged along or near the surface of data bridge 180. The data bridge 180 includes submicron interconnects 151 arranged in parallel from a first edge to an opposed edge of the data bridge 180.

The high-performance IC 130 is coupled to the high-performance IC 133 by way of submicron interconnects 160 arranged along or near the surface of data bridge 181. The data bridge 181 includes submicron interconnects 151 arranged both in parallel and in an "L"-shape from a first edge to an adjacent edge of the data bridge 181. The high-performance IC 130 is coupled to the transceiver 120 by way of submicron interconnects 150 arranged along or near the surface of the transceiver 120. Like the data bridge 180 and the data bridge 181, which include respective sets of submicron interconnects 151, 160, the submicron interconnects 150 can be arranged in multiple layers on or near the surface of the transceiver 120.

In addition to being conductively coupled with the high-performance IC 130, the high-performance IC 131 is also conductively coupled by way of submicron interconnects 152 on the data bridge 182 with the high-performance IC 132. The high-performance IC 134 is conductively coupled with the high-performance IC 133 by way of submicron interconnects 154 arranged along the data bridge 184. In addition to being coupled to the high-performance IC 133, the high-performance IC 134 is further coupled to high-performance IC 132 by way of submicron interconnects 162 arranged along the data bridge 183. The data bridge 183 includes submicron interconnects 162 arranged both in parallel to one another and in a "T"-shape from opposing edges of the data bridge 183 to an adjacent edge of the data bridge 183. The arrangement of the "T"-shaped interconnects 162 further couple the high-performance IC 132 to the high-performance IC 135. In an alternative embodiment (not shown), a data bridge such as the data bridge 183 may be arranged with interconnects configured to couple a first or source high-performance IC to two destination high-performance ICs. The high-performance ICs 130-135 can be microprocessors, application-specific ICs (ASICs), cross-bar switches, repeaters, routers or other semiconductor based devices with densely arranged input/output signal interfaces along their respective perimeters.

The high-performance IC 122 is also conductively coupled to the transceiver 122 by way of submicron interconnects 153 arranged on or near the surface of the transceiver 122. Accordingly, high-speed data signals traverse a plane substantially parallel with the upper surface of the silicon platen 110 across one or more data bridges 180-184 as well as across or near the surface of one or more ICs such as the transceiver 120 and the transceiver 122. The plane is substantially parallel to that defined by the X-axis and the Y-axis in FIG. 1A. Note that not all high-speed data signals (in an electrical format) will originate and or terminate at the transceiver 120 or the transceiver 122.

The submicron metal interconnects of the data bridges 180-184 and across the surfaces of the transceivers 120, 122 provide an interconnect density and signal integrity between the coupled ICs that is substantially similar to that provided by internal connections in the high-performance ICs. This is made possible by constructing the data bridges 180-184 and the transceiver 120, 122 with the same semiconductor manufacturing technology and materials that are used to produce the VLSI density high-performance ICs. Accordingly, each of the data bridges provides a similar signal data bandwidth and signal integrity as that provided by the internal circuitry within each of the high-performance ICs.

As best observed in FIG. 1B, the TICA 100 further provides an overall configuration that accommodates high power consumption and thermal energy dissipation. The TICA 100 includes a first stack 102, a second stack 104, and a third stack 106. Each of the stacks 102, 104, 106 consist of a high-performance IC and a supplemental IC. The first stack 102 includes a high-performance IC 130 and an IC 170. The second stack 104 includes a high-performance IC 131 and an IC 172. The third stack 106 includes a high-performance IC 132 and an IC 174. In this implementation, the high-performance ICs 130, 131, 132 include respective upper surfaces that can be coupled to one or more heat sinks or silicon plates (not shown in FIG. 1B) for removing heat energy from the stacks 102, 104, 106.

Power and ground paths are provided to the high-performance IC 130 by way of corresponding TSVs in the IC 170 and the silicon interposer 110. In some embodiments, control signals or other circuit connections can be provided to circuit elements in the IC 170 by way of the TSVs. As described above, circuit elements in the IC 170 (i.e., a supplemental IC) consume significantly less power than the corresponding high-performance IC 130 in the stack 102. An independent connector 192, with flexible cabling for thermal compliance (not shown), can be provided at or near the surface 112 of the interposer 110 opposite the first stack 102.

Similarly, power and ground paths and perhaps control signals and other circuit connections are provided to the high-performance IC 131 by way of corresponding TSVs in the IC 172 and in the interposer 110. In some embodiments, control signals or other circuit connections can be provided to circuit elements in the IC 172 by way of the TSVs. An independent connector 194, with flexible cabling for thermal compliance (not shown), can be provided at or near the surface 112 of the interposer 110 opposite the second stack 104.

Additionally, power and ground paths and perhaps control signals and other circuit connections are provided to the high-performance IC 132 by way of corresponding TSVs in the IC 174 and in the interposer 110. In some embodiments, control signals or other circuit connections can be provided to circuit elements in the IC 174 by way of the TSVs. An independent connector 196, with flexible cabling for thermal compliance (not shown), can be provided at or near the surface 112 of the interposer 110 opposite the third stack 106.

The first stack 102 and the second stack 104 are linked by the data bridge 180. As described above, the data bridge 180 includes a VLSI-density bus of submicron interconnects at or near a surface of the data bridge 180 that is adjacent to and that partially overlaps corresponding active surfaces of the high-performance IC 130 and the high-performance IC 131. High-speed signaling (i.e., data transfers) between the first stack 102 and the second stack 104 is accomplished electrically through the above-described VLSI-density bus provided by a data bridge 180.

The second stack 104 and the third stack 106 are linked by the data bridge 182. As described above, the data bridge 182 includes a VLSI-density bus of submicron interconnects at or near a surface of the data bridge 182 that is adjacent to and that partially overlaps corresponding active surfaces of the high-performance IC 131 and the high-performance IC 132. High-speed signaling (i.e., data transfers) between the second stack 104 and the third stack 106 is accomplished electrically through the above-described VLSI-density bus provided by a data bridge 182. Similar high-speed data connections are made between the other high-performance ICs on the TICA 100 that are partially obscured from view in FIG. 1B.

The TICA 100 also provides for high-speed data transfers to off-TICA communication devices at or near the perimeter. Such off-TICA signaling might be implemented electrically with pluggable connectors similar to those of conventional printed circuit boards, or the off-TICA signaling might be accomplished optically, as suggested in FIG. 1A and FIG. 1B, by electrically coupling an optical device 140 to the transceiver 120 and an optical device 142 to the transceiver 122.

As further illustrated in FIG. 1B, the TICA 100 is defined by tiers or regions arranged along the Z-axis. A power and ground tier, labeled "P&G Tier," includes the interposer 110 among additional features such as the independent connectors 190, 192, 194, 196, 198. In the illustrated embodiment, the power and ground tier has an upper boundary that coincides with the uppermost surface of the interposer 110. TSVs traverse the interposer 110 in registration with the transceiver 120, the IC 170, the IC 172, the IC 174 and the transceiver 122. A base tier or region, labeled "Base Tier," includes sets of disparate and supplemental ICs that support the high-performance ICs 130, 131, 132 as well as additional devices in the second tier. The base tier has a lower boundary that coincides with the upper boundary of the power and ground tier and an upper boundary that approximately coincides with the upper surfaces of the transceiver 120, the IC 170, the data bridge 180, the IC 172, the data bridge 182, the IC 174 and the transceiver 122. As explained above, respective sets of N electrical conductors (the submicron interconnects) are arranged substantially along these surfaces in both the X-axis and the Y-axis.

The IC 170, the IC 172 and the IC 174 are members of a first set of supplemental ICs in the base tier. The first set of supplemental ICs include respective arrays of TSVs to convey power and electrical ground from the interposer 110 to respective ICs in a second tier adjacent to the base tier. The IC 170 includes an array of TSVs to convey power and electrical ground from the interposer 110 to the high-performance IC 130. The IC 172 includes an array of TSVs to convey power and electrical ground to the high-performance IC 131. The IC 174 includes an array of TSVs to convey power and ground to the high-performance IC 132. In addition to providing power and electrical ground, this first set of supplemental ICs may further include respective memory elements (e.g., a DRAM), bypass capacitors, transistors, electrostatic-discharge protection circuits, among other circuits or devices that can support the operation of a corresponding high-performance IC. When the IC 170 includes a DRAM, an array of additional pillars or solder bumps may be provided at the interface between the adjacent surfaces of the high-performance IC 130 and the IC 170 to provide command and data interfaces between the devices. The interface between the adjacent surfaces of the high-performance IC 131 and the IC 172 and the interface between adjacent surfaces of the high-performance IC 132 and the IC 174 may be similarly configured.

The data bridge 180 includes a first data terminal arranged along a first edge of the data bridge 180 and a second data terminal arranged along a second edge of the data bridge 180. In the illustrated embodiment, the first data terminal and second data terminal are arranged along opposing edges of the data bridge 180. The data bridge 180 is not so limited. However arranged, the first data terminal and the second data terminal are connected to each other by the submicron interconnects 151. The first data terminal overlaps a corresponding edge of an active surface of the high-performance IC 130. The second data terminal overlaps a corresponding edge of an active surface of the high-performance IC 131. One or both of the first data terminal and the second data terminal may include a capacitive proximity coupler. Alternatively, one or both of the signal interfaces at the first data terminal and the second data terminal may be conductively (ohmically) connected, e.g. fusion bonded or soldered, to a corresponding structure of the high-performance IC 130 and a corresponding structure of the high-performance IC 131, respectively.

Preferably, the data bridge 180 is entirely passive (i.e., non-active or unpowered). Alternatively, when a separation distance between the high-performance IC 130 and the high-performance IC 131 exceeds a distance that can be supported by the input/output interfaces of the high-performance IC 130 and the high-performance IC 131, the data bridge 180 can be powered or active by way of additional TSVs (not shown) provided in the interposer 110. In this alternative or active embodiment, the data bridge 180 may include buffers, amplifiers, latches or other devices to support the high-speed data signals communicated along the submicron interconnects 151.

As illustrated by the alternating arrangement of the IC 170, the data bridge 180 and the IC 172, etc., adjacent members of the first set of base tier ICs (i.e., the IC 170, the IC 172 and the IC 172) are separated from each other by the data bridge 180 and the data bridge 182, respectively. This alternating arrangement of ICs can be continued by the lateral addition of a third data bridge in the base tier with an additional high-performance IC in the adjacent second tier as may be desired.

As shown in FIG. 1B, the second tier, labeled "$2^{nd}$ Tier," includes the high-performance IC 130, the high-performance IC 131, the high-performance IC 132, an optical device 140 and an optical device 142. A lower border of the second tier is shared with the upper border of the base tier. An upper border of the second tier is proximal to the uppermost surfaces of the high-performance ICs 130, 131, 132 and may or may not be proximal to the uppermost surfaces of the optical device 140 and the optical device 142.

As shown in FIGS. 1A and 1B, the optical module 140 is coupled to the transceiver 120 converts electrical signals communicated from the high-performance IC 130 on submicron interconnects 150 to respective optical signals that can be conveyed via fiber or light pipes to one or more off TICA destinations. The transceiver 120 is an IC that communicates high-speed data signals as well as power and electrical ground to the optical module 140 by way of the dedicated connector 190 and TSVs in the interposer 110. A transceiver data terminal is arranged along an edge of the transceiver 120 that is adjacent and parallel to an overlapping edge of the active surface of the high-performance IC 130. The data terminal may include one or more capacitive proximity couplers or one or more features that may conductively couple the interconnects 150 on the transceiver 120 to corresponding structures of the high-performance IC 130.

An optical module 142 coupled to the transceiver 122 converts electrical signals communicated from the high-performance IC 132 on submicron interconnects 153 to respective optical signals that can be similarly conveyed or transmitted to one or more off TICA destinations. The transceiver 122 is an IC that communicates high-speed data signals as well as power and electrical ground to the optical module 142. A corresponding transceiver data terminal is arranged along an edge of the transceiver 122 that is adjacent and parallel to an overlapping edge of the active surface of the high-performance IC 132. The transceiver data terminal may include one or more capacitive proximity couplers or feature that may conductively couple the interconnects 153 on the transceiver 122 to a corresponding structure of the high-performance IC 132.

Each of the power and electrical ground connections at the interfaces between the respective ICs and the interposer 110 of the TICA 100 are illustrated in FIG. 1B as a solder bumps Those skilled in the art of manufacturing multiple IC assemblies will understand that conductive coupling can be performed by soldering, as well as thermo-compression bonding, or fusion bonding. Those skilled in the art will further recognize that there is a continuum of bonding techniques that vary temperature and pressure to enable the bond with fusion bonding at one extreme and thermo-compression bonding at the other extreme. The TICA 100 can be assembled using any of the above-described techniques to complete the various metal-to-metal connections.

As illustrated in FIG. 2, a third tier, labeled "3rd Tier," lies above the second tier or region. The third tier may include one or more elements or features for assembling the TICA 200 and/or for transferring thermal energy in a direction substantially orthogonal to the line A-A or away from the TICA 200. In the illustrated embodiment, the third tier includes a silicon platen 210 and a heat sink 220. The silicon platen 210 provides a surface 214 for mounting and aligning the high-performance ICs 130, 131, 132, etc., while data bridges (e.g. the data bridge 180 and the data bridge 182) and supplemental ICs 170, 172, 174 can be coupled or bonded to them. The silicon platen 210 provides an opposed surface 212 for supporting a heat sink 220 or some other heat transfer element.

One or both of the silicon platen 210 and/or the heat sink 220 may be arranged with one or more passages for transporting a liquid. An example passage 222 can be connected by various connections (not shown) to an external thermal control system to remove heat energy from the TICA 100. For these, silicon platens and or heat sinks, the transfer of thermal energy can be reversed as may be desired. In alternative embodiments (not shown) thermal energy can be passively transferred by way of a heat sink without passages for transporting fluids or actively transferred by way of one or more Peltier-effect devices (i.e., thermoelectric devices) coupled to an electrical thermal control system.

As described above, high-speed data signal paths arranged along an edge of the high-performance ICs 130, 131, 132, etc. are coupled along the X-axis and the Y-axis via the various data bridges 180-184 arranged along the TICA 200. In the illustrated embodiment, the data bridges 180-184 include passive circuit traces or conductors and are arranged in or near the respective surfaces of silicon chips that are substantially thinner than those of the IC 170, the IC 172 and the IC 174 in the base tier. The silicon chips used to form the various data bridges 180-184 have been thinned to accommodate some dimensional variation in the Z-axis across the overlapping regions of the adjacent high-performance ICs. Each of the data bridges 180-184 enable the TICA 200 to be arranged in a tiered configuration with high-speed signal transfers being conveyed in an X-Y plane and the stacked combinations of a high-performance IC and zero, one or more supplemental ICs arranged along the Z-axis as shown in FIG. 2.

FIGS. 3A-3E schematically illustrate a method for manufacturing a portion of the tiered IC assembly 200 of FIG. 2. In FIG. 3A, a silicon platen 210 is provided. The silicon platen 210 has a base surface 212 and a mounting surface 214 that is opposed to the base surface 212. A high-performance IC 131 and a high-performance IC 130 are arranged in close registration with each other and with the silicon platen 210. Adjacent edges of the high-performance IC 131 and the high-performance IC 130 are separate from each other in accordance with a distance, L, defined by the length of electrical connections or submicron interconnects 151 interposed between a first data terminal 382 and an opposed second data terminal 384 on or near a surface of the data bridge 180. The first data terminal 382 and the opposed second data terminal 384 include a plurality of respective features for coupling densely spaced high-speed parallel signal paths along respective edges of the data bridge 180. The desire is not to necessarily space or separate high-performance ICs by some target distance. The goal is to interconnect high-performance ICs while facilitating thermal energy transfer from a stack of coupled ICs.

The high-performance IC 131 is configured with a terminal 342 and a terminal 344 arranged along the edges of a mounting surface 343. The mounting surface 343 further includes an array of respective conductive features 345 for coupling power and electrical ground to the high-performance IC 131. In some embodiments, additional signal connections other than those that conduct power and ground can be provided on the mounting surface 343. The terminal 342 includes a plurality of respective features for coupling densely spaced high-speed parallel signal paths and is arranged along a first edge of the high-performance IC 131. The terminal 344 is similarly arranged along an opposing edge of the high-performance IC 131. The terminal 344 overlaps and can be arranged in registration with the terminal 382 of the data bridge 180. The high-performance IC 130 is configured with a terminal 332 and a terminal 334 arranged along a mounting surface 333. The mounting surface 333 further includes an array of respective conductive features 335 for coupling power and electrical ground to the high-performance IC 130. In some embodiments, additional signal connections other than those that conduct power and ground can be provided on the mounting surface 343 and the mounting surface 333. The terminal 332 includes a plurality of respective features for coupling densely spaced high-speed parallel signal paths and is arranged along a first edge of the high-performance IC 130. The terminal 332 overlaps and can be arranged in registration with the terminal 384 of the data bridge 180. The terminal 334 is similarly arranged along an opposing edge of the high-performance IC 130.

A mounting or inactive surface 341 of the high-performance IC 131 is attached to the mounting surface 214 of the silicon platen 210. The attachment can be made with accurate alignment to the high-performance IC 131 and planarity of surface 341 to surface 214 by fusion bonding surface 341 to surface 214 without the addition of bonding materials, e.g. adhesive or solder. Similarly, a mounting or inactive surface 331 of the high-performance IC 130 is fusion bonded to the mounting surface 214 of the silicon platen 210 with accurate alignment to the high-performance IC 130.

A supplemental IC 172 is provided in registration with the high-performance IC 131. As explained above, the supplemental IC 172 includes an array of TSVs 363 and in some embodiments can include one or more additional circuit elements such as but not limited to memory elements, bypass capacitors, transistors, electrostatic discharge protection circuits, among other relatively low-power consuming devices. The supplemental IC 172 has a mounting surface 361 and an opposed surface 362 as well as an array of TSVs 363, which traverse the supplemental IC 172. The TSVs 363 are further arranged to couple respective features 345 of the high-performance IC 131. In addition, a supplemental IC 170 is provided in registration with the high-performance IC 130. The supplemental IC 170 has a mounting surface 371 and an opposed surface 372 as well as an array of TSVs 373, which traverse the supplemental IC 170. The TSVs 373 are further arranged to couple respective features 335 of the high-performance IC 131.

In FIG. 3B, the various ICs introduced in the exploded view in FIG. 3A are illustrated after they have been bonded or otherwise coupled to the TSVs of supplemental IC 172 and supplemental IC 170 to corresponding pads on high-performance IC 131 and on high-performance IC 130, respectively. This electrical and mechanical coupling between the IC 172 and the high-performance IC 131 and between the IC 170 and the high-performance IC 130 can be implemented by microsolder bumps or by fusion bonding the TSVs to the corresponding features 326, 335 (e.g., pads). In FIG. 3C, the intermediate assembly illustrated in FIG. 3B is inverted and an array of solder bumps 382 is applied to the TSVs 373 arranged in the supplemental IC 170. A respective array of solder bumps 384 is applied to the TSVs 363 arranged in the supplemental IC 172. Alternatively, fusion bonding of flat metal pads to the TSVs 363, 373 is possible. In addition, a silicon interposer 110 is provided in registration with the intermediate assembly. The silicon interposer 110 includes an array of TSVs 392 arranged for coupling with respective solder bumps 382 and an array of TSVs 394 arranged for coupling with respective solder bumps 384. Alternatively, fusion bonding of flat metal pads to the TSVs 392, 394 is possible for coupling the interposer 110 to the sub-assembly. In FIG. 3D, the intermediate assembly of FIG. 3B is coupled to the silicon interposer 110 by heating the solder bumps 382 and the solder bumps 384 and later cooling the solder bumps 382 and the solder bumps 384. FIG. 3D shows the subsequent assembly.

In FIG. 3E, a heat sink 220 is attached to the base surface 212 in a position that is substantially aligned with the vertically arranged stack of the supplemental IC 170 and the high-performance IC 130 as well as the vertically arranged stack of the supplemental IC 172 and the high-performance IC 131. As shown in FIG. 3E, power and ground connections, i.e., electrical energy, enter the assembly from a first or lowermost surface of the silicon interposer 110 and thermal energy exits the assembly in the same direction from the base surface 212 of the silicon platen 210.

Figure 4:
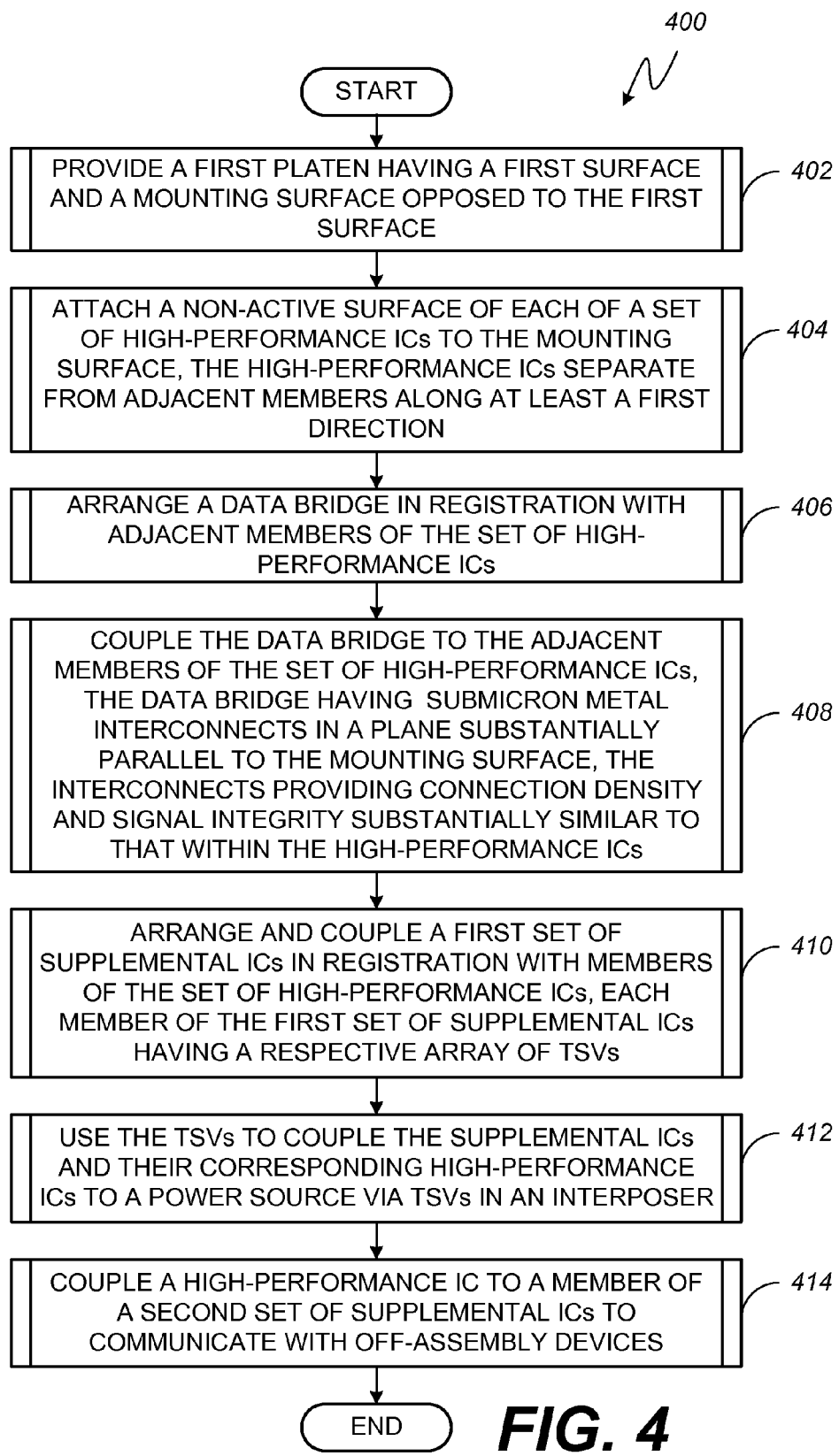
FIG. 4 is a flow chart illustrating an embodiment of a method for assembling the tiered IC assembly of FIG. 2.

FIG. 4 is a flow chart illustrating an embodiment of a method 400 for assembling a TICA such as the example TICA 200 illustrated in FIG. 2. The method 400 begins with block 402 where a first platen 210 having a first surface 212 and an opposed mounting surface 214 is provided. In block 404 a non-active surface of each of a set of high-performance ICs (e.g., high-performance IC 130) are attached to the mounting surface 214. As further indicated in block 404, the high-performance ICs are separate from adjacent members along at least a first direction such as along the X axis. In block 406, a data bridge 180 is arranged in registration with adjacent members (e.g., the high-performance IC 130 and the high-performance IC 131) of the set of high-performance ICs. Thereafter, as indicated in block 408, the data bridge 180 is coupled to the adjacent members of the set of high-performance ICs. As further shown in block 408, the data bridge 180 includes submicron interconnects (i.e., electrical conductors) in a plane substantially parallel to the mounting surface 214. As indicated above, the submicron interconnects of the data bridge 180 provide an interconnect density and signal integrity between the second set of ICs coupled by the data bridge 180 that is substantially similar when compared to the interconnect density and signal integrity provided by internal connections within the high-performance ICs that comprise the second set of ICs.

In block 410, a first set of supplemental ICs is arranged in registration with respective members of the set of high-performance ICs. As further indicated in block 410, each member of the first set of supplemental ICs includes an array of TSVs. In block 412, the TSVs of the first set of supplemental ICs are used to couple the corresponding high-performance IC to a power source by way of a silicon interposer 110. Thereafter, in block 414, the high-performance IC is coupled to a member of a second set of supplemental ICs such as a transceiver 120 or a transceiver 122 to communicate with off-assembly devices by way of a corresponding optical device 140 and an optical device 142. As indicated above, the tiered assembly may be configured with separate and distinct connectors to provide power supply voltages and electrical ground connections to each active IC in the assembly. As also explained above, solder bumps and or pillars may be used to physically support one or more the ICs in the tiered assembly.

The flow chart in FIG. 4 describes a sequence of steps for assembling an example embodiment of a TICA. Those skilled in the art will appreciate that some of the steps can be accomplished in alternative sequences. For example, a bridge die or chip (e.g., the data bridge 180) can be coupled to a first member (e.g., the high-performance IC 130) of the set of high-performance ICs and to a second member (e.g., the high-performance IC 131) of the set of high-performance ICs in any order. Furthermore, this coupling can occur in substantially simultaneous steps that are accomplished before coupling the staggered sub-assembly of ICs to a substrate, heat sinks, and/or connectors containing power, ground, and in some embodiments control signals.

Figure 5:
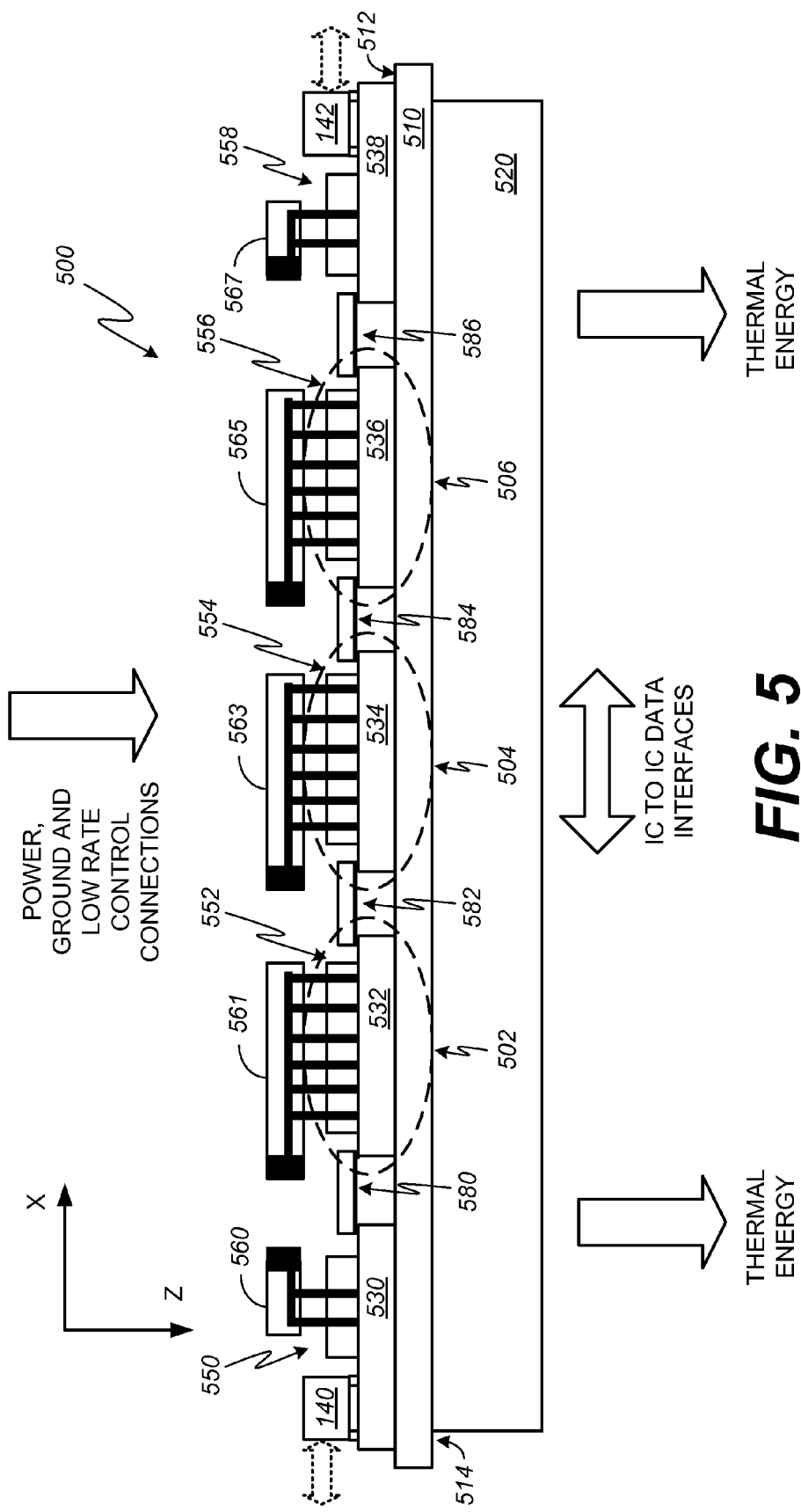
FIG. 5 is a cross-sectional view of an alternative embodiment of a tiered IC assembly.

FIG. 5 is a cross-sectional view of an alternative embodiment of a TICA 500. The TICA 500 includes a silicon substrate or platen 510. The silicon platen 510 is coupled to a heat sink 520 along a first major surface 514. An opposed major surface or mounting surface 512 of the silicon platen 510 supports corresponding inactive surfaces of laterally disposed high-performance ICs such as high-performance IC 532, high-performance IC 534, and high-performance IC 536. The laterally arranged high-performance ICs communicate with each other and additional IC devices by way of parallel high-speed data paths (e.g., submicron metal interconnects) provided along or near corresponding surfaces of data bridges, such as data bridge 582, data bridge 584, and data bridge 586, located between the various ICs. The TICA 500 includes a first stack 502, a second stack 504, and a third stack 506. Each of the first stack 502, the second stack 504, and the third stack 506 consist of a high-performance IC and a single supplemental IC. As indicated above, one or more of the stacks may include additional supplemental ICs.

As also described above, the high-performance IC is a high-performance device that dissipates relatively more power and generates relatively more heat than the supplemental IC or ICs with which it is coupled in a corresponding stack. The first stack 502 includes a high-performance IC 532 and a supplemental IC 552 coupled to each other by an array of TSVs arranged along the Z direction and that traverse the IC 552. The second stack 504 includes a high-performance IC 534 and a supplemental IC 554 connected to one another by a corresponding array of TSVs that traverse the IC 554 in the Z direction. The third stack 506 includes a high-performance IC 536 and a supplemental IC 556 connected to one another by a corresponding array of TSVs that also traverse the IC 556 in the Z direction. The high-performance IC 532, the high-performance IC 534 and the high-performance IC 536 can be microprocessors, ASICs, cross-bar switches, repeaters, routers or other application specific semiconductor based devices with densely arranged input/output signal interfaces along their respective perimeters. As further described above, power and ground paths (and possibly control or other low-data rate signals) are provided to the respective high-performance ICs 532, 534, 536 by way of the TSVs and corresponding electrical connectors coupled on the opposing side of the supplemental IC 552, the supplemental IC 554 and the supplemental IC 556. The TSVs may be coupled to corresponding electrical conductors in the various connectors by way of solder bumps, conductive pillars, etc.

An independent connector 561, with flexible cabling for thermal compliance (not shown), is coupled at or near a surface of the supplemental IC 552. The connector 561 is located above the stack 502 and provides power, ground and perhaps additional signals to the ICs in the stack 502. Similarly, an independent connector 563, with flexible cabling for thermal compliance (not shown), is coupled at or near a surface of the supplemental IC 554. The connector 563 is located above the stack 504 and provides power, ground and perhaps additional signals to the ICs in the stack 504. An independent connector 565, with flexible cabling for thermal compliance (not shown), is coupled at or near a surface of the supplemental IC 556. The connector 565 is located above the stack 506 and provides power, ground and perhaps additional signals to the ICs in the stack 506.

The first stack 502 and the second stack 504 both support and are linked by a data bridge 582. The second stack 504 and the third stack 506 both support and are linked by a data bridge 584. The first stack 502 is further coupled to a transceiver IC 530 by a data bridge 580 and the third stack 506 is coupled to a transceiver IC 538. As described above, the data bridges 580, 582, 584 and 586 each include submicron metal interconnects at or near a respective surface that is adjacent to and that partially overlaps corresponding active surfaces of the adjacent IC pairs coupled by the respective data bridges. As also described above, the respective data bridges 580, 582, 584 and 586 can be connected at one or both data terminals by a metal-to-metal coupling, such as a fusion bond or by a capacitive proximity coupling technique. High-speed signaling (i.e., data transfers) between the stacks (i.e., from a first stack to an adjacent stack) and between the stacks and corresponding transceiver ICs (i.e., transceiver 530 and transceiver 538) is accomplished electrically through the above-described submicron interconnect bus provided by the respective data bridges 580, 582, 584 and 586. However, the TICA 500 also provides for high-speed data transfers to off-TICA communication devices at or near the perimeter of the silicon platen 510. Such off-TICA signaling might be implemented electrically with pluggable connectors similar to those of conventional printed-circuit boards, or the off-TICA signaling might be accomplished optically, as suggested in FIG. 5.

As illustrated in FIG. 5, an optical device 140 that transmits and receives optical signals is electrically and physically supported by the transceiver 530. A dedicated connector 560 provides power and ground connections to the transceiver 530 via an IC 550. The IC 550 includes an array of TSVs to provide power and ground connections to the transceiver 530. As described above, high-speed data connections between the transceiver 530 and the adjacent stack 502 are made by way of the data bridge 580. A second optical device 142 that transmits and receives optical signals is electrically and physically supported by the transceiver 538. A dedicated connector 567 provides power and ground connections to the transceiver 538 via an IC 558. The IC 558 includes an array of TSVs to provide power and ground connections to the transceiver 538. As described above, high-speed data connections between the transceiver 538 and the adjacent stack 506 are made by way of the data bridge 586.

Figure 6:
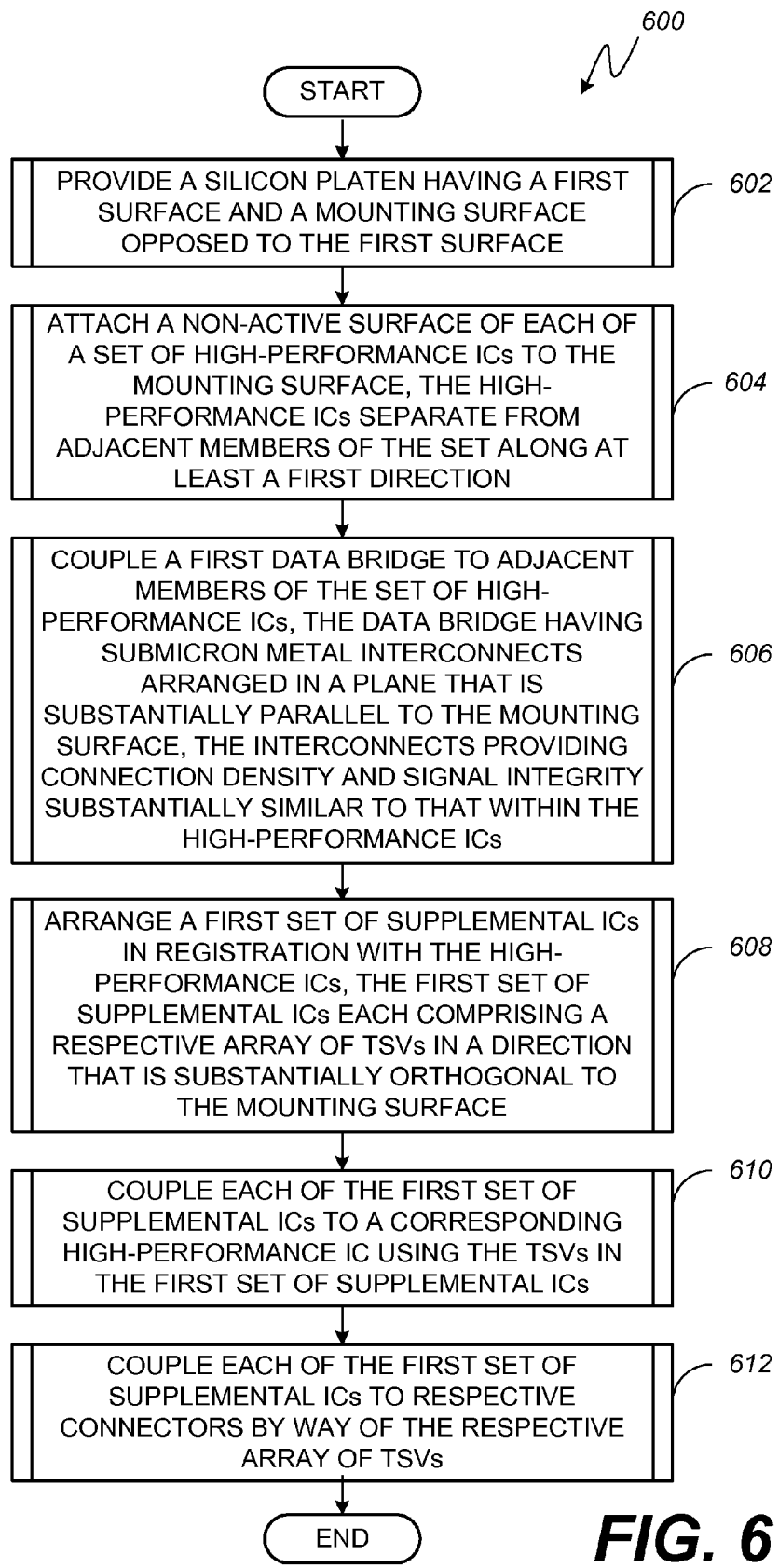
FIG. 6 is a flow chart illustrating an embodiment of a method for assembling the tiered IC assembly of FIG. 5.

FIG. 6 is a flow chart illustrating an alternative embodiment of a method 600 for assembling a TICA such as the TICA 500 introduced in FIG. 5. The method 600 begins with block 602 where a silicon platen 510 having a first surface 514 and an opposed mounting surface 512 is provided. In block 504, a non-active surface of each of a set of high-performance ICs are attached to the mounting surface 512 of the silicon platen 510. As further indicated in block 604, the individual members of the set high-performance ICs are separate from adjacent members along at least a first direction. In block 606, a data bridge 582 is coupled to adjacent members (e.g., the high-performance IC 532 and the high-performance IC 534) of the set of high-performance ICs. As described above and further shown in block 606, the data bridge 582 includes submicron metal interconnects arranged in a plane that is substantially parallel to the mounting surface of the silicon platen 510 upon which the TICA 500 is constructed. Thereafter, as indicated in block 608, a first set of supplemental ICs are arranged in registration with corresponding high-performance ICs. As further shown in block 608, the first set of supplemental ICs each have an array of TSVs in a direction that is substantially orthogonal to the mounting surface 512. In block 610, each of the first set of support ICs is coupled to a corresponding high-performance IC by the TSVs in the first set of supplemental ICs. Thereafter, as shown in block 612, each of the first set of supplemental ICs are coupled to respective connectors by way of the exposed end of the TSVs.

Although the remaining steps necessary to complete the TICA 500 are not shown directly in the flow diagram illustrated in FIG. 6, such as, for example, mounting a transceiver 530, coupling a data bridge 580 to the transceiver 530 and to the high-performance IC 532, and mounting an optical device 140 on the transceiver 530, among other steps, persons having ordinary skill in the art will be able to complete construction of the TICA 500 and related tiered assemblies upon inspection of FIG. 5.

While various example embodiments of the tiered IC assemblies and methods for manufacturing the same have been described, it will be apparent to those skilled in the art that many more embodiments and implementations are possible that are within the scope of this disclosure. Accordingly, the described IC assemblies and methods for their construction are not to be restricted or otherwise limited except in light of the attached claims and their equivalents.

What is claimed is:

1. A tiered assembly of integrated circuits (ICs), comprising:
   a base tier including a first set of ICs and a data bridge, the ICs each having a respective array of through silicon vias (TSVs), the data bridge having submicron metal interconnects arranged in a plane that is substantially orthogonal to a longitudinal axis of the TSVs; and
   a second tier adjacent to the base tier, the second tier including a second set of ICs, different from the first set of ICs, at least two members of the second set of ICs coupled to each other by the data bridge, the submicron metal interconnects of the data bridge providing an interconnect density and signal integrity between the second set of ICs coupled by the data bridge that is substantially similar to that provided by internal connections in the second set of ICs, wherein the second set of ICs generate thermal energy at a rate that requires an external thermal transfer element to maintain thermal equilibrium within the respective members of the second set of ICs.

2. The assembly of claim 1, wherein respective major surfaces of the first set of ICs and the data bridge are substantially parallel.

3. The assembly of claim 2, wherein adjacent members of the first set of ICs are separated from each other by the data bridge.

4. The assembly of claim 1, wherein the first set of ICs comprises circuits that in operation generate thermal energy at a rate that results in thermal equilibrium within the respective members of the first set of ICs in the absence of a thermal transfer element.

5. The assembly of claim 1, wherein the first set of ICs comprises one or more of a memory element, a bypass capacitor, a power regulating transistor, and an electrostatic discharge protector.

6. The assembly of claim 1, wherein the submicron metal interconnects are made with technology similar to that used in making the second set of ICs.

7. The assembly of claim 1, wherein the submicron metal interconnects include at least one arranged with an angle.

8. The assembly of claim 1, wherein the base tier further comprises a third set of ICs, the third set of ICs coupled to corresponding members of the second set of ICs.

9. The assembly of claim 8, wherein the third set of ICs electrically support an optical device.

10. The assembly of claim 8, wherein a member of the third set of ICs is coupled to a member of the second set of ICs by submicron metal interconnects arranged in a plane that is substantially orthogonal to a longitudinal axis of the TSVs.

11. The assembly of claim 1, further comprising:
a third tier adjacent to the second tier and removed from the base tier, the third tier comprising a thermal transfer element.

12. The assembly of claim 11, wherein the thermal transfer element comprises a heat sink.

13. The assembly of claim 11, wherein the thermal transfer element comprises a silicon platen.

14. The assembly of claim 1, further comprising:
a power interface tier adjacent to the base tier and removed from the second tier, the power interface tier including a respective connection that provides a supply voltage from an external source to each member of the second set of ICs by way of the TSVs in the first set of IC devices.

15. The assembly of claim 14, wherein the power interface tier comprises a silicon support structure with TSVs arranged in registration with corresponding TSVs of the first set of ICs.

16. A tiered integrated circuit (IC) assembly, comprising:
a first tier including a first set of ICs and a data bridge, the first set of ICs each having a respective array of through silicon vias (TSVs), the data bridge including submicron metal interconnects arranged near a surface of the data bridge; and
a second tier adjacent to the first tier, the second tier including a second set of ICs that generate thermal energy at a rate that requires an external thermal transfer element to maintain thermal equilibrium, adjacent members of the second set of ICs coupled to one another by the data bridge, the submicron metal interconnects of the data bridge providing an interconnect density and signal integrity between the second set of ICs coupled by the data bridge that is substantially similar when compared to the interconnect density and signal integrity provided by internal connections in the second set of ICs, the data bridge being supported along at least two edges by the adjacent members of the second set of ICs.

17. The assembly of claim 16, further comprising:
respective connectors coupled to each member of the first set of ICs; and
a silicon structure directly supporting the second tier.

18. The assembly of claim 16, further comprising:
wherein the second tier further comprises a third set of ICs that electrically support a respective optical device; and
a second data bridge between a member of the third set of ICs and an adjacent member of the second set of ICs, the second data bridge providing data signals in a direction that is substantially orthogonal to a longitudinal axis of the TSVs.

* * * * *